(12) United States Patent
Mikhemar et al.

(10) Patent No.: US 8,886,147 B2
(45) Date of Patent: Nov. 11, 2014

(54) CONCURRENT IMPEDANCE AND NOISE MATCHING TRANSCONDUCTANCE AMPLIFIER AND RECEIVER IMPLEMENTING SAME

(75) Inventors: Mohyee Mikhemar, Irvine, CA (US); Hooman Darabi, Laguna Niguel, CA (US)

(73) Assignee: Broadcom Corporation, Irvine, CA (US)

( * ) Notice: Subject to any disclaimer, the term of this patent is extended or adjusted under 35 U.S.C. 154(b) by 503 days.

(21) Appl. No.: 12/804,396

(22) Filed: Jul. 20, 2010

(65) Prior Publication Data

US 2012/0021713 A1   Jan. 26, 2012

(51) Int. Cl.
*H04B 1/16* (2006.01)
*H04B 1/18* (2006.01)
*H03F 1/22* (2006.01)
*H03F 1/56* (2006.01)
*H03F 3/193* (2006.01)

(52) U.S. Cl.
CPC .................. *H04B 1/18* (2013.01); *H03F 1/223* (2013.01); *H03F 1/565* (2013.01); *H03F 3/193* (2013.01); *H03F 2200/222* (2013.01); *H03F 2200/294* (2013.01)
USPC ......................... 455/232.1; 455/254; 455/341

(58) Field of Classification Search
CPC ............ H04B 1/16; H04B 1/18; H03F 1/223; H03F 1/565; H03F 3/193; H03F 2200/222; H03F 2200/294
USPC ........... 455/130, 232.1, 234.1, 254, 296, 307, 455/323, 334, 339, 91, 341; 327/551, 554; 330/282, 293
See application file for complete search history.

(56) References Cited

U.S. PATENT DOCUMENTS

| 2007/0218857 A1* | 9/2007 | Ismail et al. .................. 455/323 |
| 2008/0076363 A1* | 3/2008 | Rafi et al. ........................ 455/91 |
| 2009/0021295 A1* | 1/2009 | Fu et al. ........................ 327/551 |
| 2010/0259237 A1* | 10/2010 | Wang ............................ 330/293 |

* cited by examiner

*Primary Examiner* — Thanh Le
(74) *Attorney, Agent, or Firm* — Oblon, Spivak, McClelland, Maier & Neustadt, L.L.P.

(57) ABSTRACT

According to one embodiment, a concurrent impedance and noise matching transconductance amplifier designed for implementation in a receiver comprises an input device configured to couple to a matching network of the receiver, and a boost capacitor connected to the input device to increase an input capacitance of the transconductance amplifier. The boost capacitor is selected to substantially minimize the receiver noise and to enable the concurrent impedance and noise matching of the receiver and the matching network. In one embodiment, the receiver comprises the transconductance amplifier to provide an amplified receive signal, and a mixer to produce a down-converted signal corresponding to the amplified receive signal, wherein the mixer is coupled to the transconductance amplifier by a blocking capacitor. The blocking capacitor is selected to substantially increase an amplitude ratio of the down-converted signal to the amplified receive signal to substantially increase the front-end gain of the receiver.

19 Claims, 4 Drawing Sheets

CONCURRENT IMPEDANCE AND NOISE MATCHING TRANSCONDUCTANCE AMPLIFIER AND RECEIVER IMPLEMENTING SAME

BACKGROUND OF THE INVENTION

1. Field of the Invention

The present invention is generally in the field of electronic circuits and systems. More specifically, the present invention is in the field of communications circuits and systems.

2. Background Art

Transceivers are typically used in communications systems to support transmission and reception of communications signals through a common antenna, for example, at radio frequency (RF) in a cellular telephone or other mobile communication device. Because a receiver implemented in a communications transceiver may be called upon to amplify and process a weak receive signal, receiver noise may be a particular source of concern. Receiver noise can occur in the form of front-end noise, for example, or as noise produced by the receiver matching network. In addition, flicker noise may be produced by a mixer circuit utilized to down-convert a receive signal.

In a conventional receiver, the problem of flicker noise may be largely resolved through placement of a blocking capacitor, which is typically selected to be as large as possible for maximum noise suppression, between the transconductance amplifier situated at the input of the receiver, and the mixer. Unfortunately the presence of a large blocking capacitor may reduce the overall front-end gain of the receiver, which is an undesirable result when weak receive signals are being processed.

The problems presented by the front-end noise and matching network noise may be even more intractable, because techniques directed to achieving noise matching between the receiver front-end and the matching network for the purpose of reducing their combined noise are often at odds with achieving impedance matching between the matching network and receiver front-end. As a result, conventional receiver designs must carefully balance the competing interests of noise matching and impedance matching when implementing a receiver, with advantageous improvements in one operating parameter typically resulting in undesirable deterioration of the other.

Thus, there is a need to overcome the drawbacks and deficiencies in the art by providing a receiver designed to enable concurrent impedance and noise matching with its matching network. In addition, it is desirable that the receiver avoid the reduction in front-end gain associated with flicker noise suppression in conventional receivers.

SUMMARY OF THE INVENTION

The present invention is directed to a concurrent impedance and noise matching transconductance amplifier and receiver implementing same, substantially as shown in and/or described in connection with at least one of the figures, and as set forth more completely in the claims.

DETAILED DESCRIPTION OF THE INVENTION

The present invention is directed to a concurrent impedance and noise matching transconductance amplifier and receiver implementing same. Although the invention is described with respect to specific embodiments, the principles of the invention, as defined by the claims appended herein, can obviously be applied beyond the specifically described embodiments of the invention described herein. Moreover, in the description of the present invention, certain details have been left out in order to not obscure the inventive aspects of the invention. The details left out are within the knowledge of a person of ordinary skill in the art.

The drawings in the present application and their accompanying detailed description are directed to merely exemplary embodiments of the invention. To maintain brevity, other embodiments of the invention, which use the principles of the present invention are not specifically described in the present application and are not specifically illustrated by the present drawings.

Figure 1:
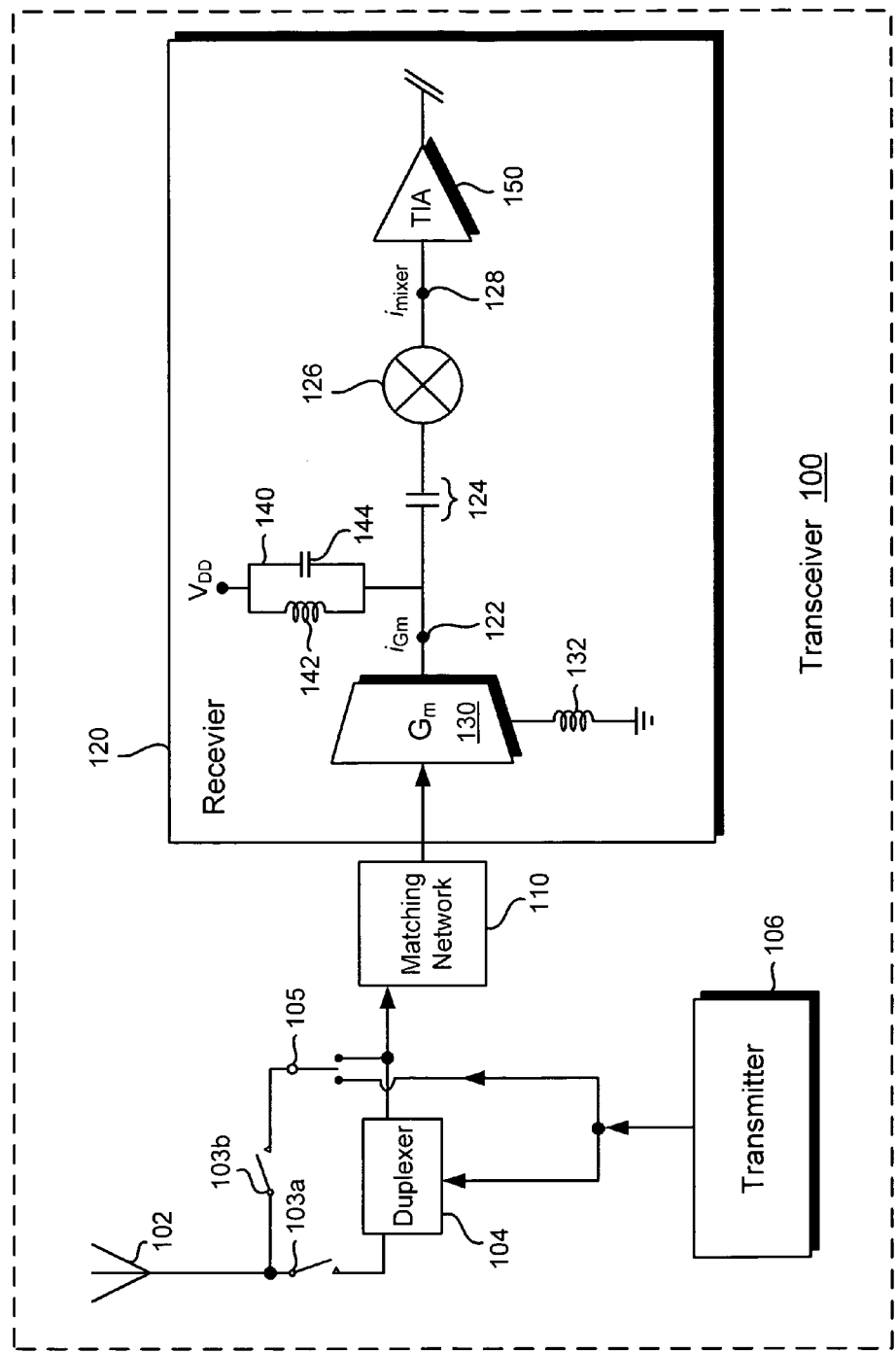
FIG. 1 is a conceptual block diagram of a transceiver including a receiver implementing a concurrent impedance and noise matching transconductance amplifier, according to one embodiment of the present invention.

FIG. 1 is a conceptual block diagram of a transceiver including a receiver implementing a concurrent impedance and noise matching transconductance amplifier, according to one embodiment of the present invention. It is noted that the arrangement shown in FIG. 1 is for the purpose of providing an overview, and elements shown in that figure are conceptual representation of physical and electrical elements, and are thus not intended to show dimensions or relative sizes or scale.

As shown in FIG. 1, transceiver 100 comprises antenna 102, transceiver input/output routing switches 103a and 103b, duplexer 104, transmit/receive (TR) switch 105, transmitter 106, receiver matching network 110, and receiver 120. Receiver 120 comprises concurrent impedance and noise matching transconductance amplifier 130 coupled to ground through inductor 132, tuning circuit 140 including tuning inductor 142 and tuning capacitor 144, blocking capacitor 124, mixer 126, and transimpedance amplifier (TIA) 150. Also shown in FIG. 1 are transconductance amplifier output node 122 providing current signal $i_{Gm}$ and mixer output node 128 providing current signal $i_{mixer}$. Transceiver 100 may be utilized in a cellular telephone or other mobile device communicating at radio frequency (RF), for example, such as in a frequency range from approximately 0.9 GHz to approximately 2.1 GHz.

According to embodiments of the present invention disclosed herein, receiver 120 is designed to overcome the drawbacks and deficiencies of conventional receiver designs by implementing concurrent impedance and noise matching transconductance amplifier 130, and by optimizing blocking capacitor 124 so as to produce substantial gain between transconductance amplifier output node 122 and mixer output node 128. Mixer 126 can comprise a passive mixer, for example, in which case the gain produced between transconductance amplifier output node 122 and mixer output node 128 can be substantially noise free passive gain enhancing the overall front-end gain of receiver 120. Moreover, optimization of blocking capacitor 124 to provide additional gain is achieved by significantly reducing the size of blocking capacitor 124 compared with conventional implementations. Thus, as communications technologies continue to move in the direction of smaller device and circuit dimensions, as represented, for example, by the 40 nm technology node and beyond, the more compact receiver architecture disclosed herein is particularly well suited to meet those fine dimensional constraints.

Concurrent impedance and noise matching transconductance amplifier 130 is configured to substantially maximize power transfer from matching network 110 while also substantially minimizing the total receiver noise resulting from the combined noise contributions of matching network 110 and the front-end noise produced by receiver 120. Consequently, unlike conventional receiver designs unable to reconcile concurrent impedance and noise matching, embodiments of the present invention need neither sacrifice power transfer to improve noise, nor tolerate higher noise in order to avoid attenuating a weak receive signal during its transition into receiver 120 via matching network 110. In one embodiment, receiver 120 including concurrent impedance and noise matching transconductance amplifier 130 may comprise an integrated circuit (IC), fabricated on a single semiconductor die using a 40 nm technology process, for example.

Figure 2:
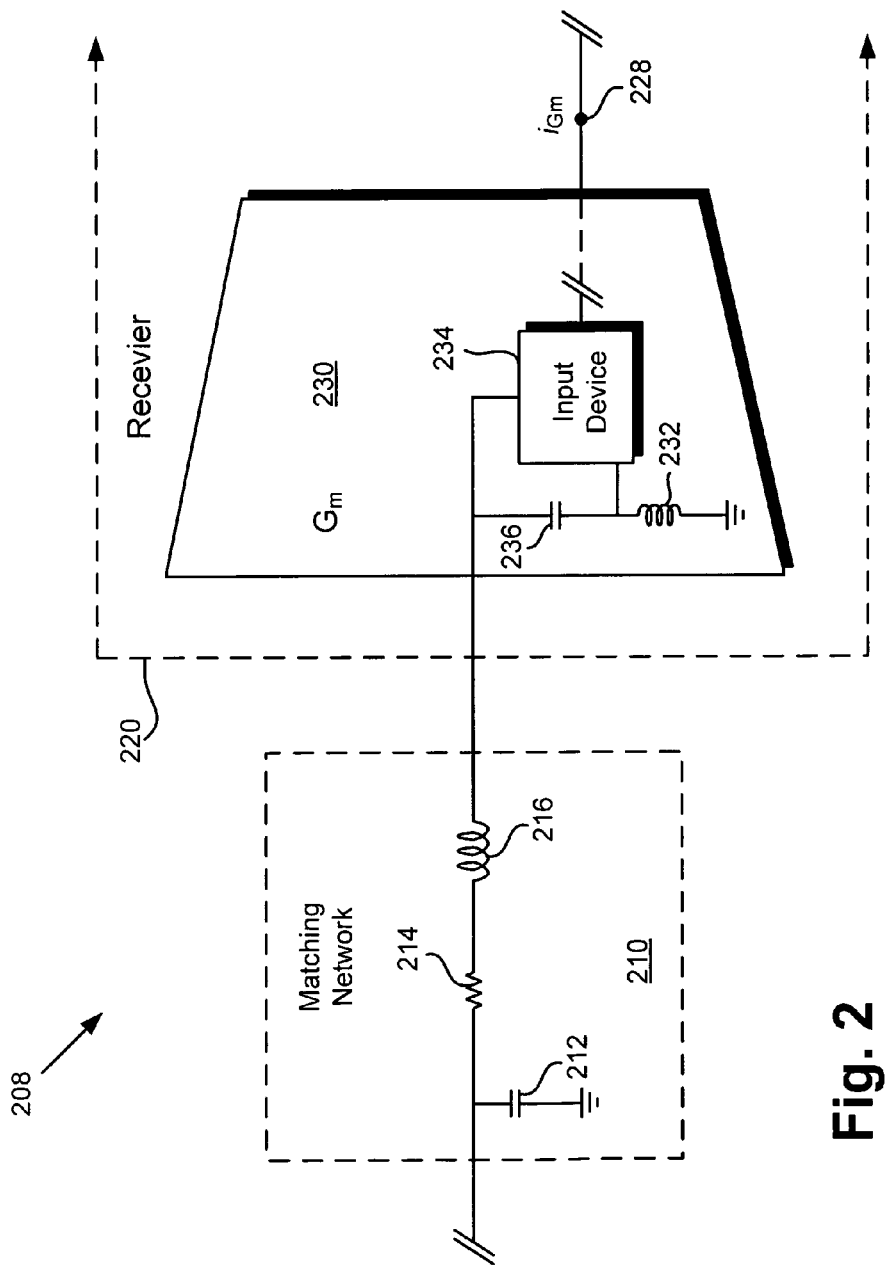
FIG. 2 is a conceptual block diagram showing a concurrent impedance and noise matching transconductance amplifier, according to one embodiment of the present invention.
Figure 3:
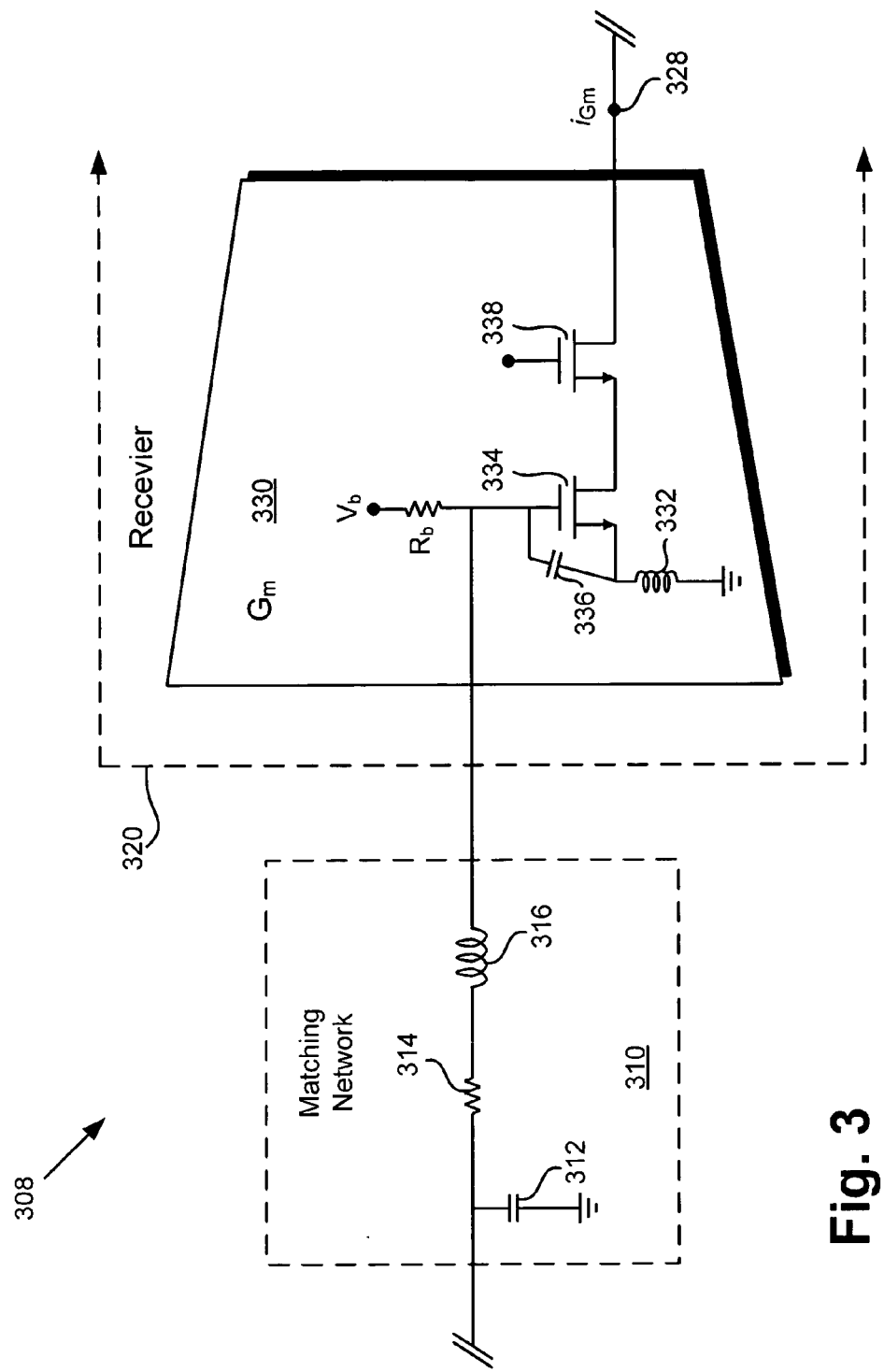
FIG. 3 is a conceptual block diagram showing a concurrent impedance and noise matching transconductance amplifier, according to one embodiment of the present to invention.
Figure 4:
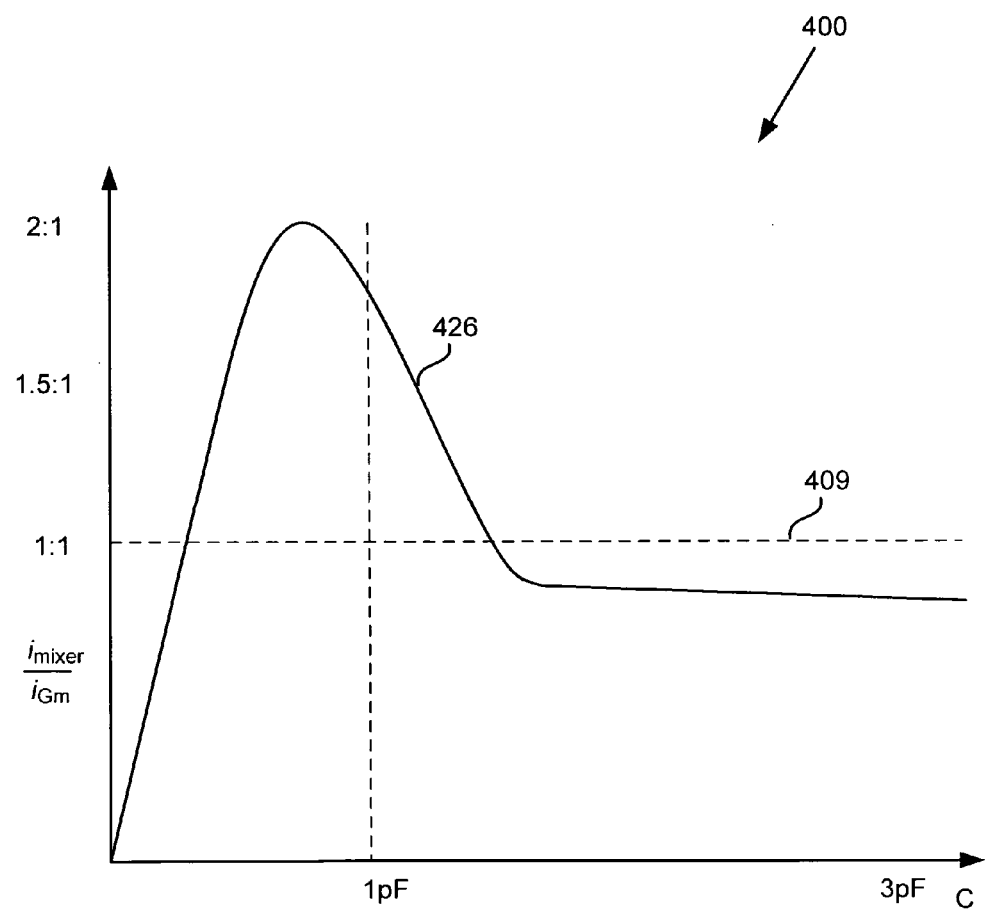
FIG. 4 is a graph showing a passive front-end gain achievable by a receiver implemented according to one embodiment of the present invention.

The operation of receiver 120 including concurrent impedance and noise matching transconductance amplifier 130 will now be further described by reference to FIGS. 2, 3, and 4. FIGS. 2 and 3 show example embodiments corresponding to concurrent impedance and noise matching transconductance amplifier 130, while FIG. 4 shows a graph of the passive gain achievable by receiver 120 through optimization of blocking capacitor 124.

Referring to FIG. 2, FIG. 2 shows receiver environment 208 including matching network 210 and receiver 220, corresponding respectively to matching network 110 and receiver 120, in FIG. 1. As shown in FIG. 2, matching network 210 includes matching network capacitor 212, matching network resistor 214, and matching network inductor 216. It is noted that matching network 210 is shown in dashed outline to indicate that the present representation of its components is not meant to be comprehensive. Thus, matching network 210 may comprise additional elements not explicitly shown in FIG. 2, as known in the art. It is further noted that the broken line entering matching network 210 from the left is provided to indicate connection of matching network 210 to other features of a receiver or transceiver environment, such as duplexer 104, in FIG. 1, for example, through which a receive signal may be routed from antenna 102 via transceiver input/output routing switch 103a, or such as T/R switch 105 through which a receive signal may be routed from antenna 102 via transceiver input/output routing switch 103b.

Receiver 220 includes concurrent impedance and noise matching transconductance amplifier 230 including inductor 232, input device 234, boost capacitor 236, and transconductance amplifier output node 228 providing current signal $i_{Gm}$. Concurrent impedance and noise matching transconductance amplifier 230, inductor 232, and transconductance amplifier output node 228 correspond respectively to concurrent impedance and noise matching transconductance amplifier 130, inductor 132, and transconductance amplifier output node 128, in FIG. 1.

It is noted that the broken dashed line connection extending to the right of input device 234 to the boundary of concurrent impedance and noise matching transconductance amplifier 130 adjoining transconductance amplifier output node 228 indicates that concurrent impedance and noise matching transconductance amplifier 230 may comprise additional internal elements not shown in FIG. 2, such as additional devices similar to input device 234, to isolate input device 234 from transconductance amplifier output node 228, for example. In addition, the broken line shown to the right of transconductance amplifier output node 228 is provided to indicate connection of transconductance amplifier output node 228 to other features internal to receiver 220, such as tuning circuit 140 and/or blocking capacitor 124, shown in FIG. 1.

The present inventors recognize that as communications technologies continue to move in the direction of smaller device dimensions and smaller power supplies, as represented, for example, by the 40 nm technology node, the input capacitance of a receiver input device may tend to grow progressively smaller. As a result, for impedance matching with a receiver matching network to occur, the inductance of the matching network inductor must become correspondingly greater. However, the matching network noise produced by a matching network is known to vary according to the size of the matching network inductance. Consequently, increasing the size of the matching network inductance to compensate for the low input capacitance of a receiver input device may result in generation of undesirably high noise levels.

The embodiment of the present invention shown in FIG. 2 shows receiver 210 configured to overcome the problem described in the previous paragraph by implementing concurrent impedance and noise matching transconductance amplifier 230. As shown in FIG. 2, concurrent impedance and noise matching transconductance amplifier 230 comprises input device 234 coupled to matching network 210. To compensate for the low intrinsic input capacitance of input device 234, boost capacitor 236 is connected to input device 234, e.g., in parallel with the input capacitance presented by input device 234, so as to increase the input capacitance of concurrent impedance and noise matching transconductance amplifier 230. By suitable selection of the capacitance of boost capacitor 236, the combination of the front-end noise of receiver 220 and the matching network noise produced by matching network 210, e.g., the "receiver noise" of receiver 220, can be substantially minimized. Moreover, substantially the same selection of an optimized capacitance for boost capacitor 236 enables concurrent impedance and noise matching of receiver 220 and matching network 210.

In some embodiments, for instance, the capacitance of boost capacitor 236 is selected according to the quality factor of matching network inductor 216. As a specific implementational example, in the absence of boost capacitor 236 and at the 40 nm node operating at a receive frequency of approximately 0.9 GHz, the noise produced by matching network 210 alone could approach 2.2 dB, which is unacceptable for many applications. However, including boost capacitor 236 selected to have a capacitance value of 250 fF or less, for example, can cause the receiver noise, e.g., the noise produced by matching network 210 combined with the front-end noise of receiver 210, to be reduced to less than or equal to approximately 2 dB.

Turning now to FIG. 3, FIG. 3 shows receiver environment 308 including matching network 310 and receiver 320 corresponding to receiver environment 208 including matching network 210 and receiver 220, in FIG. 2. Matching network 310, in FIG. 3, includes matching network capacitor 312, matching network resistor 314, and matching network inductor 316, corresponding respectively to matching network capacitor 212, matching network resistor 214, and matching network inductor 216, in FIG. 2. Moreover, receiver 320, in FIG. 3, comprises concurrent impedance and noise matching transconductance amplifier 330 including inductor 332, input field-effect transistor (FET) 334, boost capacitor 336, and transconductance amplifier output node 328 providing current signal $i_{Gm}$, corresponding respectively to concurrent impedance and noise matching transconductance amplifier 230 including inductor 232, input device 234, boost capacitor 236, and transconductance amplifier output node 228, in FIG. 2. In addition, concurrent impedance and noise matching transconductance amplifier 330, in FIG. 3, is shown to include isolation FET 338 coupled between input FET 334 and transconductance amplifier output node 328.

According to the embodiment shown in FIG. 3, input FET 334, which may be a metal-insulator-semiconductor FET (MISFET) such as a metal-oxide-semiconductor FET (MOSFET), for example, is shown to comprise a gate coupling matching network 310 and receiving a bias voltage $V_b$ through biasing resistor $R_b$. The input capacitance presented by input FET 334 in the example embodiment of FIG. 3 comprises its inherent gate-to-body capacitance. As further shown in FIG. 3, boost capacitor 336 is connected between the gate and source of input FET 334, which is shown as an n-channel device, effectively providing a boost input capacitance in parallel with the inherent gate-to-body capacitance of input FET 334. The presence of boost capacitor 336, arranged as shown in FIG. 3, increases the input capacitance of concurrent impedance and noise matching transconductance amplifier 330. As a result, boost capacitor 336 can be selected to substantially minimize the receiver noise of receiver 320 and to enable concurrent impedance and noise matching between receiver 320 and matching network 310, as described above with reference to FIG. 2.

Referring back to FIG. 1, in addition to the advantages provided by implementation of concurrent impedance and noise matching transconductance amplifier 130, receiver 120 can also be configured to achieve substantial additional front-end gain through optimization of blocking capacitor 124. As previously explained, in conventional receiver implementations, a blocking capacitor analogous to blocking capacitor 124 is typically made as large as possible to suppress the flicker noise produced by a mixer circuit analogous to mixer 126. For example, according to conventional designs, a blocking capacitor analogous to blocking capacitor 124 can have a capacitance of more than 3 pF, such as 5 pF, and is typically implemented as a fringing capacitor, which is highly consumptive of valuable circuit area.

In contrast to the conventional approach to receiver design, a receiver according to the present inventive principles implements blocking capacitor coupling mixer 126 to transconductance amplifier output node 122 so as to substantially increase the front-end gain of receiver 120. That is to say, blocking capacitor 124 is selected to substantially increase an amplitude ratio of the down-converted signal produced by mixer 126, e.g., current signal $i_{mixer}$ provided at mixer output node 128, to that of the amplified receive signal, e.g., current signal $i_{Gm}$ provided at transconductance amplifier output node 122.

As discussed above, in one embodiment, mixer 126 can comprise a passive mixer, such that the amplitude ratio of current signals $i_{mixer}$ and $i_{Gm}$ can represent substantially noise free passive gain enhancing the overall front-end gain provided by receiver 120. FIG. 4 shows a graph of the passive gain achievable in such an implementation. Graph 400, in FIG. 4, shows plot 426 of the amplitude ratio of current signals $i_{mixer}$ to $i_{Gm}$ as a function of blocking capacitance (C). At conventional implementational values for the blocking capacitance, e.g., capacitance greater than approximately 3 pF, the amplitude ratio, or gain, associated with those levels of blocking capacitance is typically less than one, as indicated by comparison of plot 426 with unity gain line 409.

Perhaps unexpectedly, however, it may be seen from FIG. 4 that for a limited range of blocking capacitance values the amplitude ratio increases substantially, displaying a peak amplitude ratio, or gain, of approximately two-to-one (2:1). For example, at the 40 nm node, a blocking capacitance of approximately 1 pF or less may be is sufficient to both suppress flicker noise produced by mixer 126 and to substantially increase the front-end gain of receiver 120. As shown in FIG. 4, such a capacitance value for blocking capacitor 124 is consistent with amplitude ratios of $i_{mixer}$ to $i_{Gm}$ greater than 1:1, such as in the range of approximately 1.5:1 to approximately 2:1, for example. It is noted that an additional advantage accruing from the present inventive concepts is the circuit area savings represented by the substantial reduction in the size of blocking capacitor 124 taught by the present inventors, e.g., implementation of a less than or equal to approximately 1 pF blocking capacitor rather than the 3 pF to 5 pF capacitance range used in conventional designs.

In one embodiment, as shown for example in FIG. 1, tuning circuit 140 may be coupled between transconductance amplifier output node 122 and blocking capacitor 124. According to the embodiment of receiver 120, tuning circuit 140 comprises an LC tank circuit including tuning inductor 142 and tuning capacitor 144. It is contemplated that a resonance phenomenon produced by the combination of tuning circuit 140 and blocking capacitor 124 can be utilized to further modulate the affect of blocking capacitance on receiver gain. As a result, the combination of tuning circuit 140 and blocking capacitor 124 may enable advantageous adjustment of the optimum capacitance selected for blocking capacitor 124 as desired, such as to increase flicker noise suppression, increase gain, or reduce circuit area consumption, for example.

Thus, by providing a transconductance amplifier including a boost capacitor enabling selective optimization of the input capacitance of a receiver implementing the transconductance amplifier, embodiments of the present invention enable concurrent impedance and noise matching between the receiver and its matching network. As a result, embodiments of the present invention can achieve substantially minimized receiver noise without compromising power transfer of weak receive signals into the receiver front-end. In addition, by optimizing the capacitance of a blocking capacitor at a capacitance substantially lower than taught by the conventional art, embodiments of the present invention enable a receiver architecture configured to have substantially increased front-end gain.

From the above description of the invention it is manifest that various techniques can be used for implementing the concepts of the present invention without departing from its scope. Moreover, while the invention has been described with specific reference to certain embodiments, a person of ordinary skill in the art would recognize that changes can be made in form and detail without departing from the spirit and the scope of the invention. The described embodiments are to be considered in all respects as illustrative and not restrictive. It should also be understood that the invention is not limited to the particular embodiments described herein, but is capable of many rearrangements, modifications, and substitutions without departing from the scope of the invention.

The invention claimed is:

1. Receiving circuitry configured to be implemented in a receiver, said receiving circuitry comprising:
   a transconductance amplifier configured to amplify a signal received from a matching network; and a blocking capacitor connected between said transconductance amplifier and a mixer, wherein said mixer is configured to output a down-converted signal corresponding to said amplified signal output by said transconductance amplifier, and said blocking capacitor is configured to increase an amplitude ratio of said down-converted signal to said amplified receive signal to increase a front-end gain produced by the receiver.

2. The receiving circuitry of claim 1, wherein said transconductance amplifier comprises:

an input transistor configured to couple to said matching network; and a boost capacitor connected in parallel with an input capacitance of said input transistor to increase an input capacitance of said transconductance amplifier, wherein said boost capacitor is configured to substantially minimize a receiver noise of said receiver and allow for concurrent impedance and noise matching of said receiver and said matching network.

3. The receiving circuitry of claim 2, wherein said substantially minimized receiver noise is less than or equal to approximately 2 dB.

4. The receiving circuitry of claim 2, wherein said input transistor comprises a field-effect transistor (FET).

5. The receiving circuitry of claim 4, wherein said boost capacitor is connected between a gate and a source of said FET.

6. The receiving circuitry of claim 2, wherein an inductor of said matching network produces a matching network inductance and said boost capacitor is selected according to a quality factor of said inductor.

7. The receiving circuitry of claim 2, wherein a capacitance of said boost capacitor is less than approximately 250 fF.

8. The receiving circuitry of claim 1, wherein said receiver comprises a radio frequency (RF) receiver.

9. The receiving circuitry of claim 1, wherein said receiver is implemented in combination with a transmitter as part of an RF transceiver.

10. A receiver producing a front-end gain, said receiver comprising:

a transconductance amplifier to provide an amplified receive signal;

a mixer to produce a down-converted signal corresponding to said amplified receive signal, said mixer coupled to said transconductance amplifier by a blocking capacitor;

wherein said blocking capacitor is selected to substantially increase an amplitude ratio of said down-converted signal to said amplified receive signal to substantially increase said front-end gain.

11. The receiver of claim 10, further comprising a tuning circuit coupled between said transconductance amplifier and said blocking capacitor.

12. The receiver of claim 10, wherein a capacitance of said blocking capacitor is less than or equal to approximately 1 pF.

13. The receiver of claim 10, wherein said amplitude ratio of said down-converted signal to said amplified receive signal is greater than 1:1.

14. The receiver of claim 10, wherein said amplitude ratio of said down-converted signal to said amplified receive signal is in a range from approximately 1.5:1 to 2:1.

15. The receiver of claim 10, wherein said mixer is a passive mixer.

16. The receiver of claim 10, wherein said receiver comprises a radio frequency (RF) receiver.

17. The receiver of claim 10, wherein said receiver is implemented in combination with a transmitter as part of an RF transceiver.

18. The receiver of claim 10, wherein said transconductance amplifier comprises an input device configured to couple to a matching network of said receiver.

19. The receiver of claim 18, wherein said transconductance amplifier comprises a boost capacitor connected to said input device to increase an input capacitance of said transconductance amplifier, wherein said boost capacitor is selected to substantially minimize a receiver noise of said receiver, and wherein said boost capacitor.

* * * * *